(12) United States Patent
Shibuya

(10) Patent No.: US 6,318,538 B1
(45) Date of Patent: Nov. 20, 2001

(54) DEVICE FOR TREATMENT OF A SUBSTRATE

(75) Inventor: Isamu Shibuya, Yokohama (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/505,630

(22) Filed: Feb. 16, 2000

(30) Foreign Application Priority Data

Feb. 16, 1999 (JP) .................................................. 11-037660

(51) Int. Cl.[7] .................................................. B65G 43/08
(52) U.S. Cl. ........................................ 198/346.2; 414/937
(58) Field of Search ............................ 198/345.1, 345.2, 198/346.2, 346.3; 414/936, 937, 933, 941, 268, 277, 280; 118/500, 503

(56) References Cited

U.S. PATENT DOCUMENTS

| 5,339,128 | | 8/1994 | Tateyama et al. ................ 354/317 |
| 5,540,098 | * | 7/1996 | Ohsawa ................................ 414/937 |
| 5,571,325 | | 11/1996 | Ueyama et al. ...................... 118/320 |
| 5,913,652 | * | 6/1999 | Zejda .................................... 198/346.2 |
| 5,915,910 | * | 6/1999 | Howells et al. ................. 414/937 X |
| 5,919,529 | | 7/1999 | Matsumura ......................... 427/398.1 |
| 6,048,268 | * | 8/2000 | Negre et al. ................... 198/346.2 X |
| 6,071,059 | * | 6/2000 | Mages et al. ..................... 414/937 X |
| 6,168,002 | * | 1/2001 | Takahashi et al. ............ 198/346.2 X |

FOREIGN PATENT DOCUMENTS 8-274140   10/1996   (JP) .

OTHER PUBLICATIONS

Patent Abstract of Japan, vol. 1996, No. 12, Dec. 26, 1996 & JP 08 222616 A (Dainippon Screen Mfg Co Ltd), Aug. 30, 1996, English Abstract.

* cited by examiner

Primary Examiner—James R. Bidwell
(74) Attorney, Agent, or Firm—Nixon Peabody LLP; David S. Safran

(57) ABSTRACT

A device for treating a substrate in which the cagelike body of the device can be made smaller and in which the waiting time in the treatment parts and the workpiece exchange time can be shortened is achieved as follows: there are two cassette receiving parts, one exposure part and one alignment part arranged in two rows. Furthermore the alignment part and the first cassette receiving part are located in the direction in which a first arm and a second arm of a workpiece transport device extend. Moreover, the two treatment parts and a second cassette receiving part are arranged such that the distances between them are identical to the distance between the first arm and the second arm. The first arm and the second arm move in the Y-direction, are extended or retracted in the X-direction at the same time, and fix the workpiece by the workpiece holding parts which are located on their tips. The workpiece is removed from the cassette of the first cassette receiving part and transported to the treatment parts. The already treated workpiece is received into the cassette of the second cassette receiving part.

3 Claims, 19 Drawing Sheets

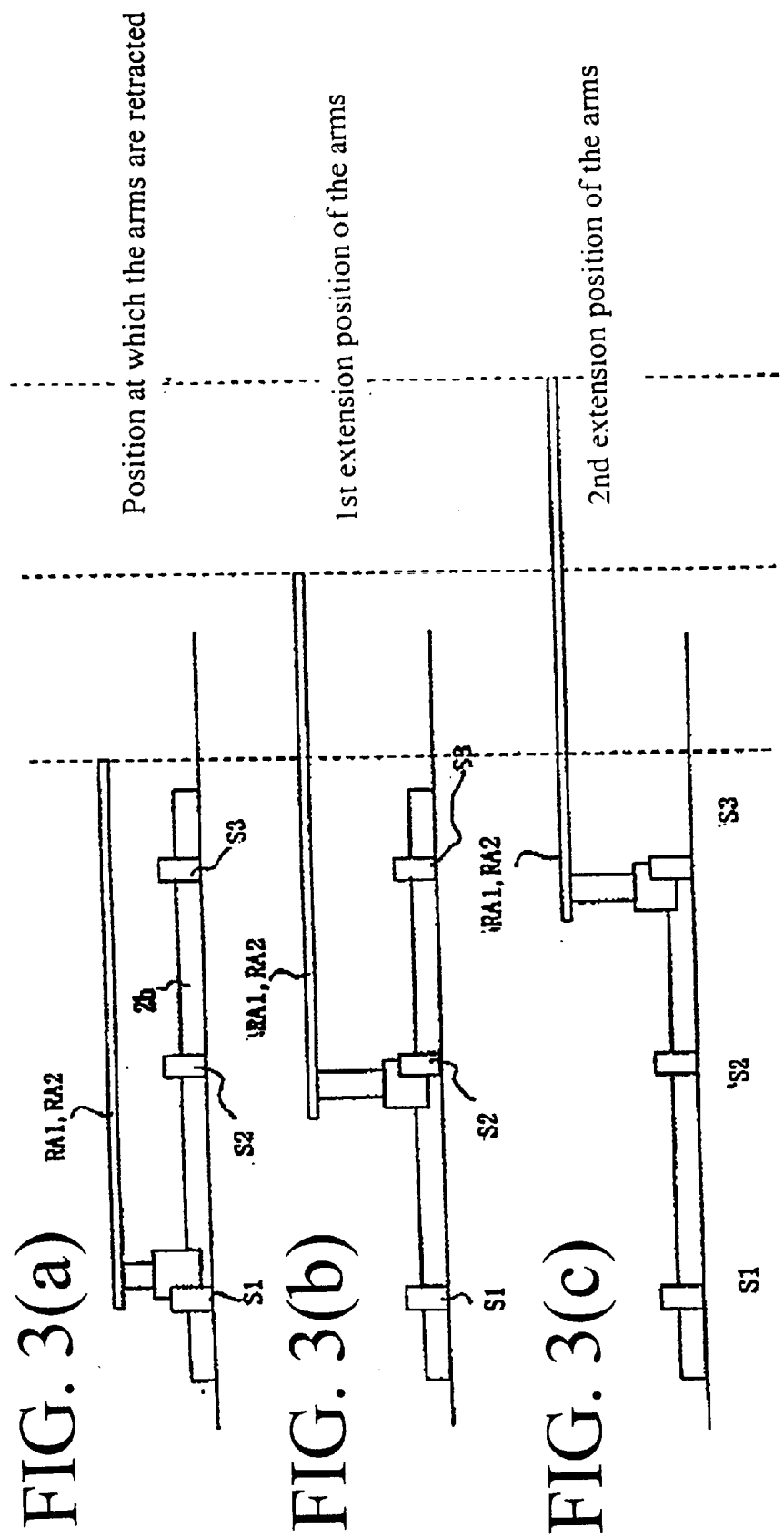

DEVICE FOR TREATMENT OF A SUBSTRATE

BACKGROUND OF THE INVENTION

1. Field of the Invention

The invention relates to a device for treatment of a substrate with which different substrates, such as for example, semiconductor devices, printed boards, LCD substrates or the like can be treated. The invention, furthermore, relates to a device for treatment of a substrate in which, after removing a workpiece from a cassette by a workpiece transport device and after a first treatment, such as for example rough alignment or the like, a second treatment, for example, exposure or the like, is performed, and the already treated workpiece is automatically transported to the cassette.

2. Description of Related Art

In a device for working and treatment of a workpiece, such as a semiconductor wafer or the like, transporting the workpiece using a robot as the transport device, which is shown, for example, in published Japanese patent application HEI 8-274140, is known.

In one such robot, a device is used in which dust formation when driving is suppressed as much as possible. It is used in a process in which there is a demand for high cleanliness.

FIG. 14 shows one example of the above described robot.

In the figure, a robot RA has a rotary part RA 20 which is pivotally supported on a base RA10, first arms RA3, RA3' which turn on the rotary part RA20, second arms RA5, RA5' which are pivotally installed on the first joints RA4, RA4' in the first arms RA3, RA3', and workpiece holding arms RA1, RA1' which are pivotally installed on the second joints RA6, RA6' in the second arms RA5, RA5'. On the tips of the workpiece holding arms RA1, RA1' which are located at the top and bottom, there are workpiece holding parts RA7, RA7' which securely hold a workpiece by vacuum Suction or the like.

In the second arms RA5, RA5', there are recess components RA8, RA8' for preventing mutual interference of the arms which are attached in the workpiece holding arms RA1, RA1'. The workpiece holding arms RA1, RA1' are pivotally installed in the second alms RA5, RA5' via the recess components RA8, RAS8'.

The workpiece holding arms RA1, RA1' each move independently of one another in the same direction (in the direction of the arrows in the drawings), the axis b of the rotary part RA2 acting as the zero point. Turning the rotary part RA20 changes the direction of the workpiece holding arms RA1, RA1'. This means that the workpiece is held securely by the two holding alms RA1 and RA1' which are located at the top and bottom. The workpiece is transported by the rotary motion.

However, in the arrangement of one Such robot, as the transport device, there are the following defects:

(1) As is shown in FIG. 14, the arms are extended or retracted. Therefore, the arms have a multi-jointed arrangement. Thus, the joints of the arms project above the robot rotary part. As a result, when the robot turns for transporting,g of the workpiece, it is necessary to ensure space for rotation so that no interference occurs between the arms, the workpiece which is held by the arms, and the other parts of the device. The cage-like body of the device therefore becomes large.

(2) The total height of the robot becomes large due to the arrangement of the joints and by the two arms being located at the top and bottom.

Therefore, it is difficult to remove the robots in the transverse direction of the cage-like body in which the robots, machining parts and the like are located. With consideration of the removal of the robot from the device, while waiting, there must be a waiting space above the robot, causing the entire device to become large.

If the robot can be removed in the transverse direction of the device, it is certainly not necessary to arrange the waiting space at the top. Since the overall height of the robot is however great, an arrangement must be made in which some of the frame of the cage-like body is absent in order to remove it in the transverse direction. In this way, however, the strength of the device is reduced, so that it cannot be done.

In one such device, on the other hand, there is a requirement for increasing the number of workpieces which can be treated within a unit of time, i.e., the throughput, as much as possible.

To improve the throughput, it is important to shorten the waiting time of the treatment parts of the device as much as possible. The expression "waiting time of the treatment parts of the device" is defined as the time after completion of treatments of the workpiece by the treatment parts until starting of treatments of the next workpiece. This time includes the time in which it is awaited for the next workpiece to be transported to the treatment part and the time in which the transported next workpiece (before treatment) is exchanged for the already treated workpiece.

To shorten the waiting time of the treatment part, it is necessary to transport the workpiece with high efficiency; this takes place as follows: Removal from the housing (cassette), in which the workpiece is located→Transport to the treatment part→reception of the already treated workpiece into the housing (cassette)

In the following, using the substrate treatment device which is shown, by way of example, in FIG. 15, the throughput for movement and treatment of the workpiece using the above described workpiece transport device is described.

In the substrate treatment device which is shown in FIG. 15, there are cassette receiving carriers CS1, CS2 (hereinafter called "cassette receiving parts") on each of which a respective housing (hereinafter called "cassette") is seated in which the workpiece is located, an alignment part FA (a first treatment part) and an exposure part WS (a second treatment part) for exposure around the circular periphery of the rotating workpiece carrier device RA.

In the above described alignment part FA, positioning is performed in order to scat the workpiece in a stipulated position of the exposure part WS. In the exposure part WS, exposure light is emitted onto the workpiece which is seated on the exposure part via a mask on which a mask pattern is formed. Thus, the mask pattern is transported to the workpiece.

The workpiece transport device RA, on its end, has plug-in workpiece holding arms RA1, RA1' which are provided with vacuum suction grooves as shown in FIG. 14.

By extending or retracting the arms RA1, RA1', the workpiece is removed from the respective site or is seated on the respective site. The workpiece which is fixed on the arms RA1, RA1' is transported by rotary motion of the workpiece transport device RA from one site to another.

The two arms RA1 and RA1' of the workpiece transport device RA are located at the top and bottom, as is shown in FIG. 14. The workpiece can be exchanged before treatment for the already treated workpiece by the two arms RA1, RA1' in the treatment parts FA, WS.

In the following, the sequence of workpiece transport in the case of using the workpiece transport device in FIG. 14 is described for the substrate treatment device in FIG. 15:

In this case, for example, processes are imagined in which the workpiece W is removed from a cassette 1 which is located in the first cassette receiving part CS1 and after treatment is received into a cassette 2 which is located in the second cassette receiving part CS2, as is shown in FIGS. 16(a) and 16(b).

(1) As is shown in FIG. 16(a), the first arm RA1 is extended in the direction toward the first cassette receiving part CS1 and holds n-th workpiece Wn of cassette 1. The first arm RA1 is retracted and the workpiece Wn is removed.

(2) The workpiece transport device RA turns in the direction to the alignment part FA. The first al RA1 is extended. The workpiece Wn is placed on the alignment part FA. Then, the arm RA1 is retracted.

Alignment is performed in the alignment part FA. After completion of alignment, the first arm RA1 is extended, as is shown in FIG. 16(b), receives the workpiece Wn from the alignment part FA, and is retracted.

(3) The workpiece transport device RA turns in the direction toward the exposure part WS. As is shown in FIG. 16(c), the second arm RA1' is extended, receives the already exposed n−1-th workpiece Wn−1 from the exposure part WS and is retracted. The first arm RA1 is extended, the workpiece Wn is seated on the exposure part WS and is retracted.

(4) In the exposure part WS, the workpiece Wn is exposed. In the meantime, the workpiece transport device RA turns in the direction toward the second cassette receiving part CS2. As is shown in FIG. 16(d), the second arm RA1' is extended, receives the workpiece Wn−1 into the cassette 2 in the second cassette receiving part CS2, and is retracted.

(5) As is shown in FIG. 16(e), the workpiece transport device RA turns in the direction toward the first cassette receiving part CS1.

(6) The first arm RA1 is extended and removes the n+1-the workpiece Wn+1 of the cassette 1 of the first cassette receiving part CS1. Afterwards processes (1) to (5) are repeated.

The movement and treatment of the workpiece in the above described substrate treatment device is shown in FIG. 17, in which the x-axis plots the time and the y-axis plots the position at which the workpiece is located. The respective line represents the behavior of the workpiece flow, and the squares show that the respective treatment is being performed.

In the figure, the duration of alignment in the alignment part FA was 5 seconds and the duration of exposure in the exposure part WS was 15 seconds. Furthermore, the time in which the arms are extended, the time in which the arms are retracted, the time in which the workpiece is transferred from the arms to the respective part, and the time in which the workpiece is transferred from the respective site to the arms were each 1 second and the time in which the workpiece transport device turns is 2 seconds.

In the substrate treatment device in FIG. 15, when the workpiece in the exposure part WS is exchanged, the arms of the workpiece transport device RA must perform six movement steps, specifically, the extension of the first arm RA1, the transfer of the workpiece by the first arm RA1, retraction of the first arm RA1, the extension of the second arm RA1', transfer of the workpiece by the second arm RA1' and retraction of the second arm RA1'. The exchange time is therefore 6 ×1 seconds, i.e., 6 seconds.

Even when the exposure of the workpiece in the exposure part WS is completed, the alignment of the next workpiece is not yet ended. Therefore, the waiting time for the next workpiece is 10 seconds.

The time from starting of the treatment of the n-th workpiece Wn until starting of the treatment of the n+1-th workpiece Wn+1 in the exposure part WS, i.e., the cycle time, therefore, is 31 seconds, as is shown in FIG. 17.

In a conventional substrate treatment device, the defects were the following:

Since a workpiece transport device with a multi-jointed arrangement which has a rotary device is used, it was necessary to ensure a space for rotation so that there is no interference between the arms, the workpiece which is held by the arms, and the other parts of the device.

Since the total height of the robot is great, the cage-like body of the device is large.

The waiting time in the treatment parts and the workpiece replacement time were long. Therefore, the throughput could not be increased.

SUMMARY OF THE INVENTION

The invention was devised in order to eliminate the above described defects in the prior art. Therefore, a primary object of the invention is to devise a device for treatment of a substrate in which there need not be a waiting space for removal of the workpiece transport device, in which the cage-like body of the device can be made smaller, and in which the waiting time in the treatment parts and the time in which the transported workpiece before treatment is exchanged for the already treated workpiece can be shortened.

One of the reasons why effective transport cannot be achieved in the transport device in the conventional example is that, with reference to the two different treatment parts or cassette receiving parts, the respective workpicce cannot be simultaneously transported/removed. If, for example, the workpiece Wn can be transported from the cassette 1 to the alignment part FA, while the workpiece Wn−1 is received into the cassette 2, the alignment of the workpiece Wn can be quickly ended. Thus, the time in which the next workpiece is awaited in the exposure part WS can be shortened.

Therefore, the alms of the workpiece transport device, the respective cassette receiving part and the two treatment parts can be made and arranged such that, with respect to two different treatment parts and cassette receiving parts, simultaneous activation can be performed.

The object of the invention is achieved in a device for treatment of a substrate which comprises the following:

several cassette receiving parts, each of which has a cassette in which a respective workpiece is seated;

a first treatment part in which, with respect to the seated workpiece, a first treatment takes place;

a second treatment part in which, with respect to the seated workpiece, a second treatment takes place which follows the first treatment, and workpiece transport devices, as follows:

(1) The workpiece transport device effects transport by linear movement, not by rotary motion. The workpiece holding components are located not only at the top and bottom, but also to the right and left on the same plane. This means that the workpiece transport device has a first base plate, two second base plates which are moved linearly on the first base plate, a first transport part and a second transport part which are each located on the second base plate and are each provided with a holding component which securely holds the workpiece and move independently of one another.

(2) The above described cassette receiving parts are located on a virtual line which runs parallel to the direction of motion of the second base plate. The above described treatment parts are located on another virtual line which tins parallel to the above described virtual line.

Furthermore, the second base plates of the above described workpiece transport device can be formed as a single second base plate which combines all of the second base plates into a single base plate, and the cassette receiving parts and the treatment parts can be located on several virtual lines which run parallel to the direction of movement of the transport parts and have the same distance relative to one another as the distance between the two transport parts.

In the following, the invention is further described using several embodiments which are shown in the drawings.

BRIEF DESCRIPTION OF THE DRAWINGS

FIGS. 3(a) to 3(c) each schematically depict a respective position at which the workpiece holding arms are extended or retracted;

DETAILED DESCRIPTION OF THE INVENTION

Figure 1:
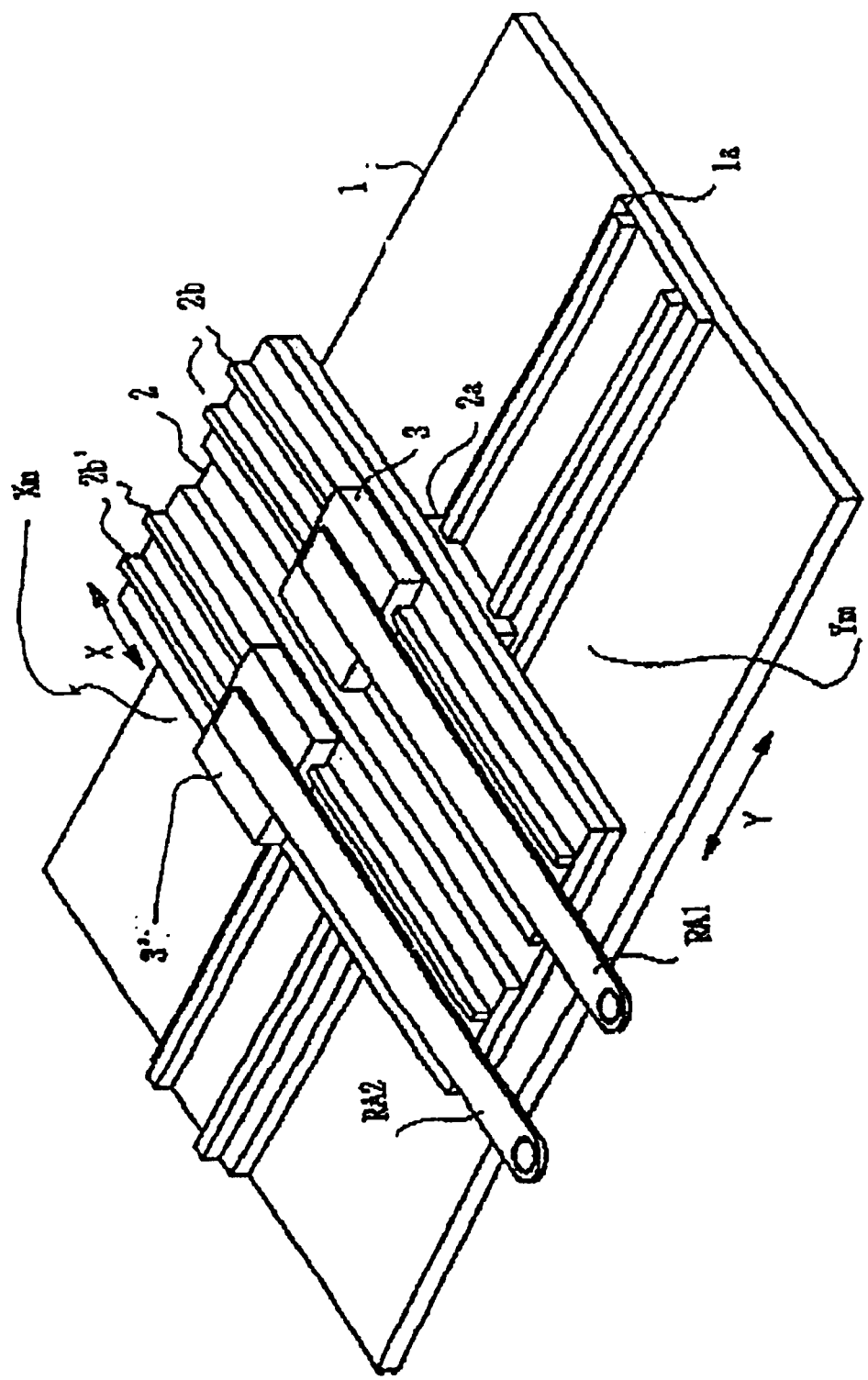
FIG. 1 is a schematic perspective view of the arrangement of a first embodiment of a workpiece transport device in accordance with the invention.

FIG. 1 shows one embodiment of a workpiece transport in accordance with the invention having a first base plate 1 which is installed on which rails 1a, and a second base plate 2 which is located on a guide 2a. The guide 2a and the second base plate 2 can be moved along the rails 1a to the right and left in the drawings (called the "Y-direction"). Between the first base plate 1 and the second base plate 2 there is a drive device which comprised of, for example, a linear motor or the like, and which drives the second base plate 2 on the first base plate in the Y-direction (the device for movement of the second base plate in the Y-direction is called the "device for movement in the Y-direction Ym").

Figure 2:
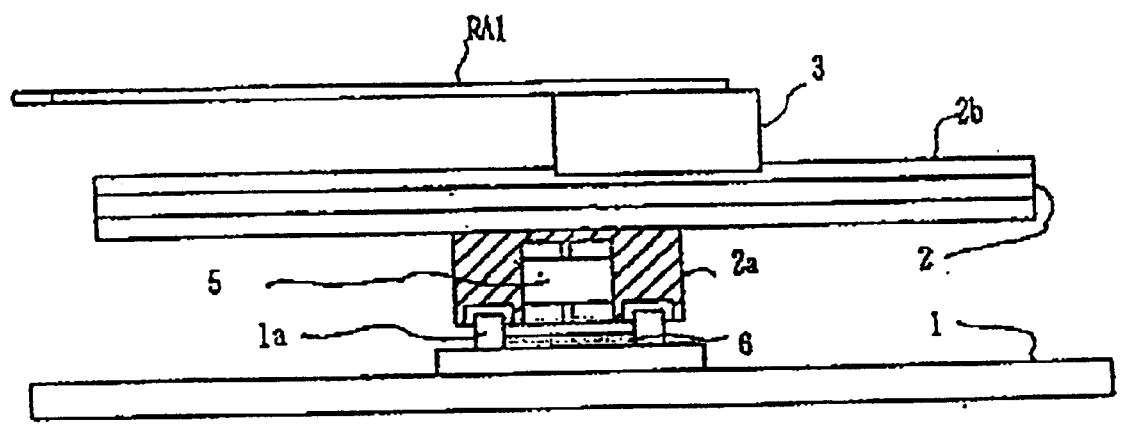
FIG. 2 is a partially sectioned, elevational view of the arrangement of an example of a drive device which moves the base plates.

FIG. 2 schematically shows one example of the above described drive device in cross section which is comprised of a linear motor which is located between the first base plate 1 and the second base plate as shown in FIG. 1. As is apparent from the drawings, within the guide 2a, there is a magnetic circuit 5. Between the rails 1a, a silicon steel plate 6 is installed. In order to move the second base plate 2, an alternating current is applied to the magnetic circuit 5 and a migrating(magnetic field is produced. This moves the second base plate 2 along the rails 1a. The drive device is furthermore provided with a position sensor, such as a coder or the like (not shown in the drawing). The second base plate 2 can be positioned relative to the first base plate with high precision by feedback of the position signal which was determined by the position sensor.

In FIG. 1, on the second base plate 2, rails 2b, 2b' are installed on which a first transport part 3 and a second transport part 3' are installed. The first transport part 3 and second transport part 3' can each be moved independently of one another along the rails 2b, 2b' on base plate 2. Between the first transport part 3, the second transport part 3' and the second base plate 2, there is the same drive device as the device as shown in FIG. 2. The first transport part 3 and the second transport part 3' are moved by means of the drive device independently of one another in the X-direction (the device for moving the first transport part 3 and the second transport part 3' in the X-direction is called the "device for movement in the X-direction Xm"). For the devices Xm and Ym, besides the above described linear motor guide, for example, a recirculating ball screw guide, a pneumatic air slider, or the like can be used.

The first transport part 3 and the second transport part 3' are each provided with a first arm RA1 and a second RA2, on the tips of which there is a workpiece holding part which securely holds the workpiece by vacuum suction or the like.

The first arm RA1 and the second arm RA2 are arranged such that they can be stopped at two locations, specifically at a first extension position of the arms and a second extension position of the arms, when they are extended.

For example, as in FIG. 3 sensors S1, S2, S3 are installed in the vicinity of the rails 2b, 2b'. Using these sensors S1 to S3, the positions of the arms RA1 and RA2 are determined and the device Xm is stopped.

As was described above, the workpiece transport device in this embodiment is arranged such that, on a single base 2, the first arm RA1 and the second arm RA2 are positioned on the left and right and are extended and retracted in the X-direction independently of one another. Therefore, the workpiece can be received from the respective site and transferred to the respective site. In this embodiment, the two arms RA1 and RA2 move as a one-part arrangement, i.e., together, in the Y-direction.

During workpiece transport, only one movement of the arms RA1 and RA2 in the X-Y directions takes place. Therefore, they do not turn like the robots in the prior art. Therefore, it is unnecessary to ensure a space for rotation of the arms and the workpiece which was held by the arms in the vicinity of the workpiece transport device. Thus, the cagelike body of the device can be made smaller.

The two arms RA1 and RA2 are, as was shown in FIG. 1, located on the right and left on the same plane. Their movements take place by a linear motor guide or the like, therefore, without joints. Thus in the workpiece transport device in this embodiment, the entire height can be reduced.

As a result, the workpiece transport device can be removed from the transverse direction of the device without a frame of the cage-like body being absent. Nor is it necessary to ensure a waiting space above the device, as was the case in the conventional example. Thus, the entire device can be made smaller.

FIG. 1 shows a case in which, on the second base plate 2, the first transport part 3 and the second transport part 3' are attached to move on the same second base 2. As is described below, using a second embodiment, however, the second base can also be divided into two base plates, one for each of the first transport part 3 and a second transport part 3', which can move independently of one another in the Y-direction.

In the following, the workpiece transport sequence in the case of using the invention for a device for treatment of a substrate is described, in which the above described workpiece is removed from the cassette, rough alignment and exposure performed and the already treated workpiece received into the cassette.

(1) Embodiment 1

Figure 4A:
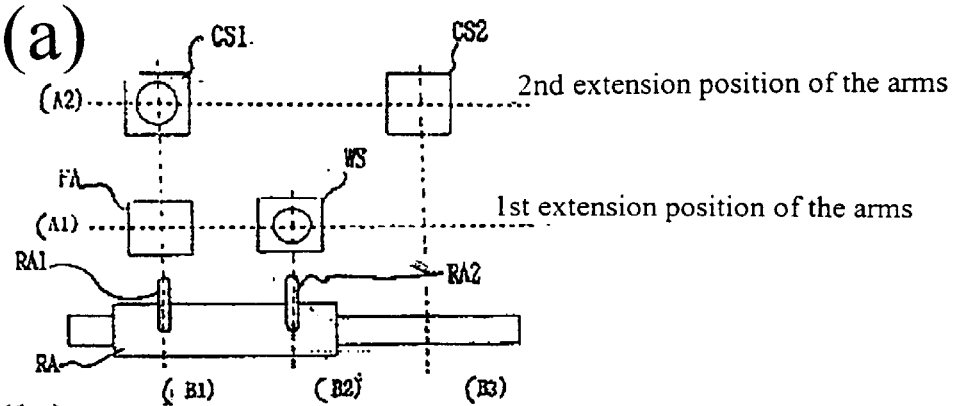
FIGS. 4(a) to 4(c) depict the workpiece transport sequence using the workpiece transport device of the first embodiment.
Figure 4B:
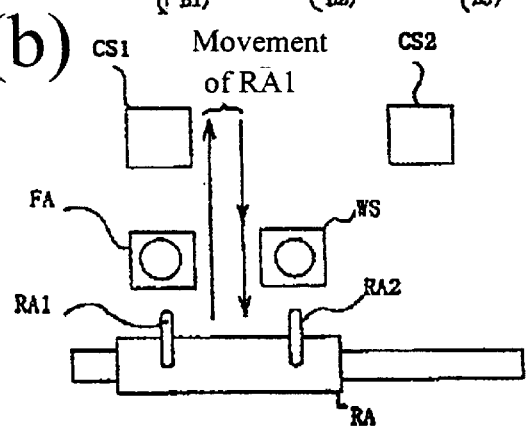
Figure 4C:
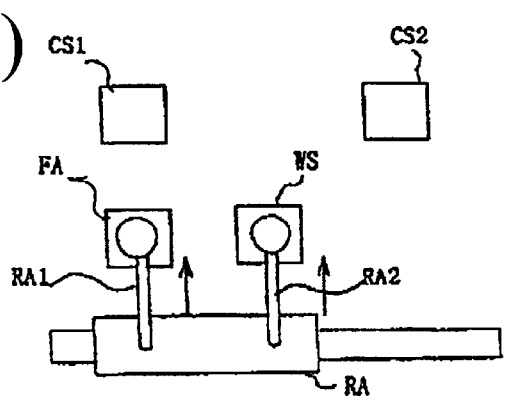

FIGS. 4 (*a*)–(*e*) and 5(*a*), 5(*b*) show the workpiece transport sequence in a device for treatment of a substrate using(the workpiece transport device which is shown in FIG. 1. In this embodiment, as is shown in FIG. 4(*a*), the exposure part WS and the alignment part FA are located on a first virtual line A1 which runs parallel to the direction of movement of the workpiece transport device RA, and the cassette receiving part CS1 and the cassette receiving part CS2 are located on a second virtual line A2 which runs parallel to the first virtual line A1.

The alignment part FA and the cassette receiving part CS1 are located on a first virtual line B1 which runs parallel to the direction of extension of the first arm RA1 and the second arm RA2. The exposure part WS is located on the second virtual line B2 which runs parallel to the first virtual line B1. The cassette receiving, part CS2 is located on a third virtual line B3 which runs parallel to the first and second virtual lines B1, B2. The distance between the first virtual line B1 and the second virtual line B2 and the distance between the second virtual line B2 and the third virtual line B3 are equal to the distance between the first arm RA1 and the second arm RA2.

The alignment part FA and the exposure part WS have arrangements in which the workpiece can be transported in/transported out, not only from the forward direction, but from each direction. However, the cassette which receives the workpiece allows transport of the workpiece in/out, based on its structure, only from one direction (from the forward direction).

In the following, using FIGS. 4(*a*)–(*c*) and FIGS. 5 (*a*), (*b*), the workpiece transport sequence is described in the case in which the workpiece W (hereinafter the n-th workpiece is labelled "Wn") is removed from a cassette 1 which is seated on the first cassette receiving part CS1, and in which the workpiece W is then received again into a cassette 2 which is seated on the second cassette receiving part CS2.

1) As is shown in FIG. 4(*a*), the first arm RA1 is located at the position opposite the first cassette receiving part CS1 and the alignment part FA. The second arm RA2 is located at the position which is opposite the exposure part WS.

2) As is shown in FIG. 4(*b*), the first arm RA1 is extended up to a second extension position which is shown in FIG. 3(*c*) and fixes the n-th workpiece Wn of the cassette 1. The first arm RA1 removes the workpiece Wn, stops at the first extension position which is shown in FIG. 3(*b*) and seats the workpiece Wn on the alignment part FA. The first arm RA1 is retracted. The workpiece Wn is aligned in the alignment part FA.

3) After completion of alignment, as is shown in FIG. 4(*c*), the first arm RA1 is extended to the first extension position and receives the workpiece Wn from the alignment part FA. Here, according to the movement of the first arm RA1, the second arm RA2 is extended to the first extension position and receives the already exposed n-1-th workpiece Wn−1 from the exposure part WS.

Figure 5A:
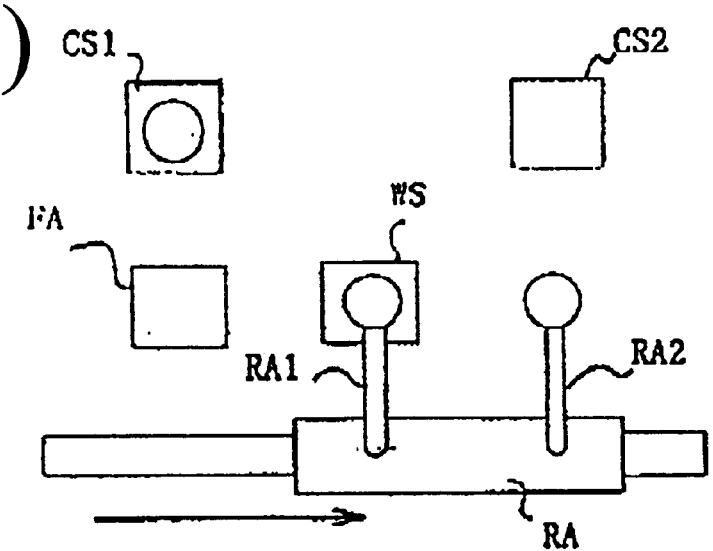
FIGS. 5(a) & 5(b) show further stages of the workpiece transport sequence using the workpiece transport device in the first embodiment.
Figure 5B:
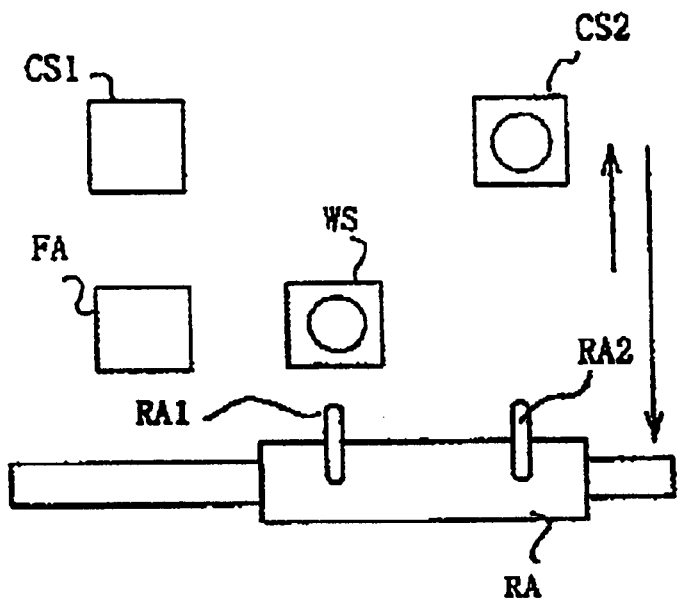

4) As is shown in FIG. 5(*a*), the first arm RA1 moves to the exposure part WS in a state in which it fixes the already aligned workpiece Wn at the first extension position. Also the second arm RA2 which fixes the already exposed workpiece Wn−1 moves at the first extension position to a site which is opposite the second cassette receiving part CS2.

5) As is shown in FIG. 5(*b*), the first arm RA1 seats the already aligned workpiece Wn onto the exposure part WS and is retracted. According to this movement, the second arm RA2 is extended to the second extension position, receives the already exposed workpiece Wn−1 into the cassette 2 and is retracted.

6) As is shown in FIG. 4(*a*), the first arm RA1 returns to the site which is opposite the first cassette receiving part CS1 and the alignment part FA and the second arm RA2 returns to the site which is opposite the exposure part WS.

7) Steps 1) to 6) are repeated.

Figure 6:
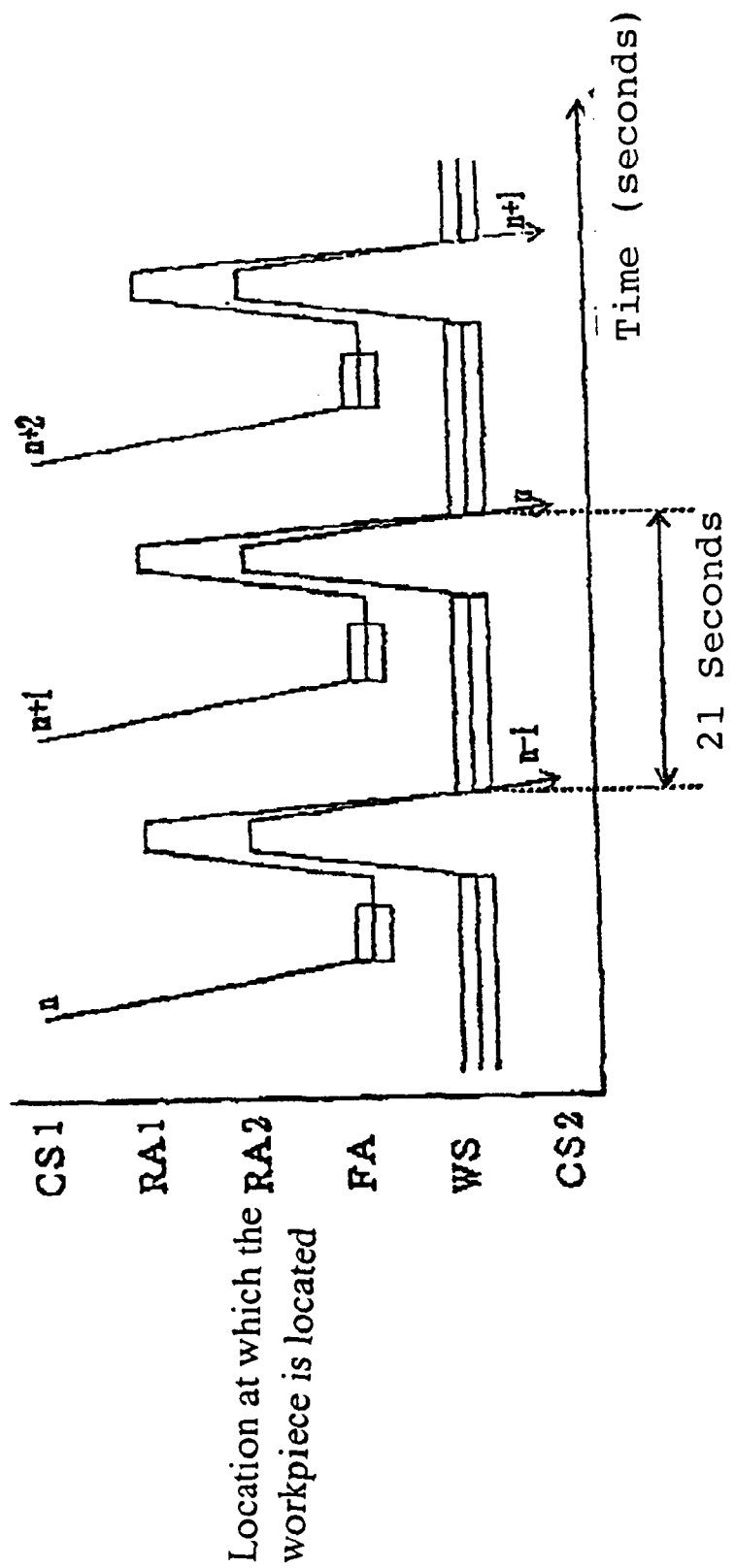
FIG. 6 is a time flow chart which shows the movement and treatment of the workpiece in the first embodiment of the invention.

FIG. 6 shows the movement and treatment of the workpiece in this embodiment. Here the x-axis, the y-axis and the respective line represent the same factors as in FIG. 17.

Figure 17:
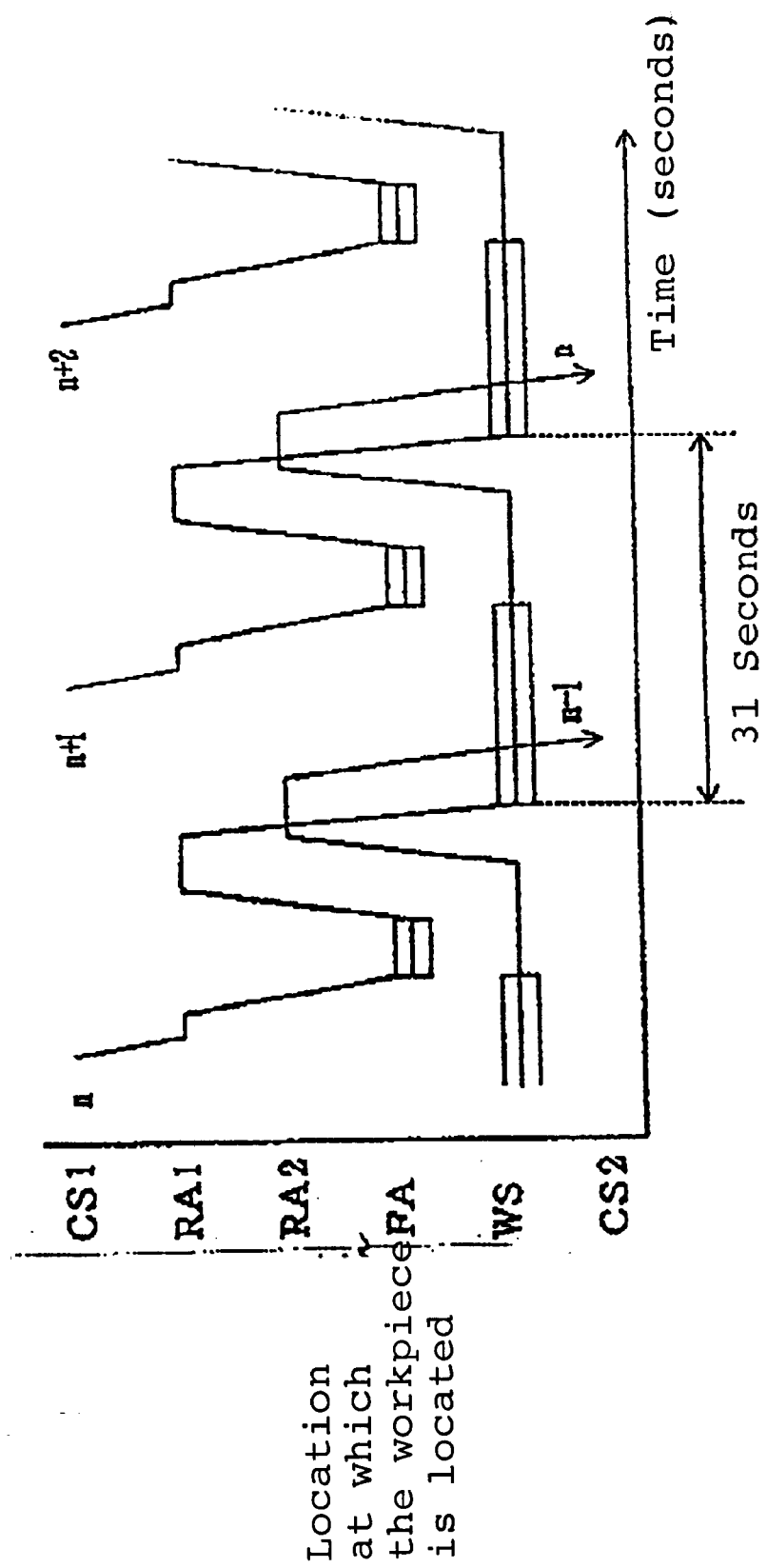
FIG. 17 is a time flow chart which shows the transport and treatment of the workpiece in the device for treatment of a substrate as shown in FIG. 15.

In the figure, the alignment time in the alignment part FA, the exposure time in the exposure part WS, the extension time of the arms and the workpiece transfer time between the arms and the respective site are identical to the times in FIG. 17. The movement time in the y-direction of the workpiece transport device is identical to the conventional rotation time and is, therefore, 2 seconds.

As is apparent from FIG. 6, the cycle time in this embodiment is 21 seconds. It has been shortened by 10 seconds as compared to the conventional example.

In this embodiment, the first arm RA1 and the second arm RA2 are located on the right and left. The distance between the two arms RA1 and RA2, the distance between the alignment part FA (the cassette receiving part CS2) and the exposure part WS and the distance between the exposure part WS and the cassette receiving part CS2 are identical to one another.

Therefore, the workpiece W can be transported out of the alignment part FA and out of the exposure part WS at the same time. Furthermore, the workpiece can be inserted into the exposure part WS and the workpiece can be received into the cassette 2 of the cassette receiving part CS2 at the same time.

As a result, the next workpiece can be removed from the cassette 1 of the cassette receiving part CS1 and aligned in an earlier step than in the conventional example. When exposure is completed in the exposure part WS, the already treated workpiece can be immediately exchanged for the next workpiece without the waiting time shown in FIG. 17 in the conventional example and exposure can be started. Thus, the throughput can be greatly improved.

By the measure (1), that when the first arm RA1 and the second arm RA2 are extended, it is possible to stop at two positions, specifically at the first arm extension position and at the second arm extension position, by measure (2) that the cassette receiving parts CS1 and CS2, the exposure part WS and the alignment part FA are located in the two rows which are shown in FIG. 4(a), and by the measure (3) that with reference to the alignment part FA and the exposure part WS, from each direction, the workpiece can be transported in/out, the workpiece transport device RA can transport the workpiece elsewhere in a state in which the arm which fixes the workpiece is at the first arm extension position.

Therefore, the time for which the arms are retracted can be saved, and therefore, the time can be shortened in which in the exposure part WS the transported next workpiece (before treatment) is exchanged for the already treated workpiece.

Furthermore, the time in which the first arm RA1 removes the workpiece W from the cassette 1 on the first cassette receiving part CS1 and seats it on the alignment part FA can be shortened. Therefore, alignment can be started in an earlier step than in the conventional example, and thus, the waiting time in the exposure part can be shortened.

(2) Embodiment 2

Figure 7:
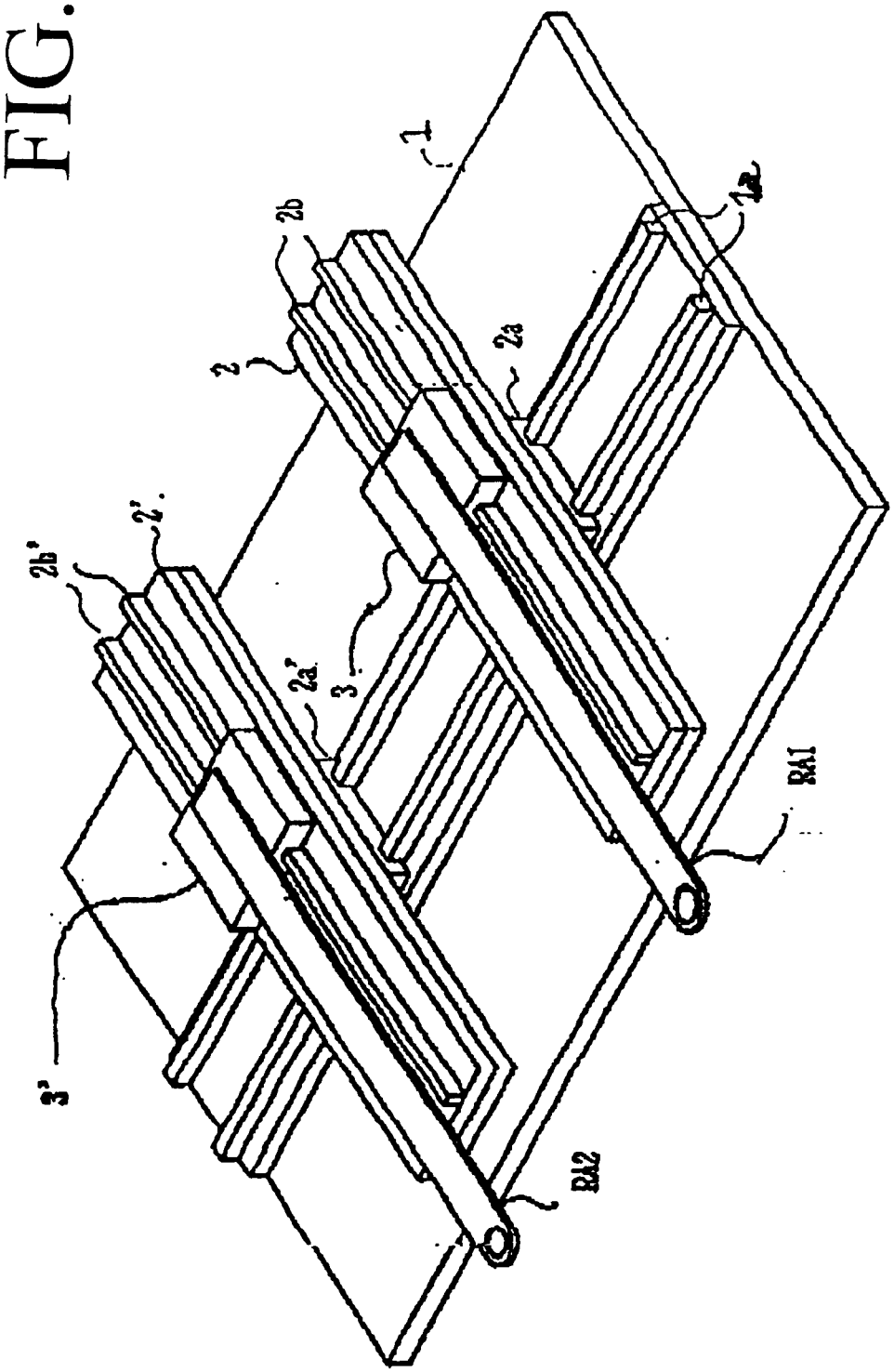
FIG. 7 is a view corresponding to that of FIG. 1, but which shows a second embodiment of the workpiece transport device of the invention.

FIG. 7 is a schematic of the arrangement of the second embodiment of a workpiece transport device in accordance with the invention. In the workpiece transport device in this embodiment, the second base plate 2 in the workpiece transport device, as compared to that which is shown in Figure 1, is divided into two parts 2, 2' on which the first transport part 3 (arm RA1) and the second transport part 3' (arm RA2) are located, and which can move independently of one another in the Y-direction, so that they do not come into contact with one another. The remaining arrangement is identical to FIG. 1.

FIGS. 8(a)–(c) and FIG. 9(a)–(c) schematically show the workpiece transport sequence in a device for treatment of a substrate using the workpiece transport device in this embodiment.

In this embodiment, the positional relationship between the alignment part FA, the exposure part WS and the cassette receiving parts CS1 and CS2 are identical to the first embodiment. As was described above, the exposure part WS and the alignment part FA are located on the first virtual line A1 and the cassette receiving parts CS1 and CS2 are located on the second virtual line A2 which runs parallel to the first virtual line A1. However, in this embodiment, it is unnecessary for the distance between the exposure part WS, the alignment part FA and the cassette receiving parts CS1 and CS2 to be identical to one another (as in the first embodiment) since, here, the alms RA1 and RA2 can move independently of one another in the Y-direction.

The arms RA1 and RA2 of the workpiece transport device RA are extended in the first embodiment in the X-direction and can be stopped at two locations, i.e., on the first arm extension position and the second arm extension position.

In the following, using FIGS. 8(a)–(c) and FIGS. 9(a)–(c), the workpiece transport sequence is described in the case in which the workpiece W is removed from the cassette 1 which is seated on the first cassette receiving part CS1 and in which the workpiece W is then received again into a cassette 2 which is seated on the second cassette receiving part CS2, as in the first embodiment.

Figure 8A:
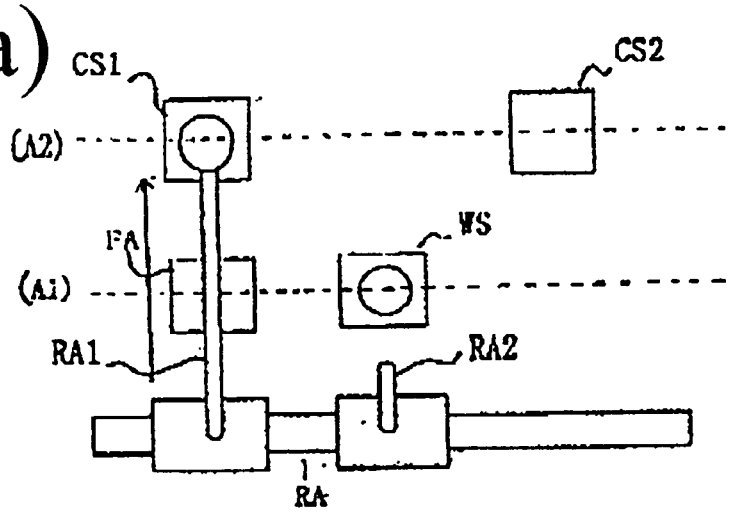
FIGS. 8(a) to 8(c) depict the workpiece transport sequence using the workpiece transport device of the second embodiment.

1) As is shown in FIG. 8(a), the first arm RA1 of the workpiece transport device RA is extended up to a second extension position and fixes the n-th workpiece Wn of the cassette 1.

Figure 8B:
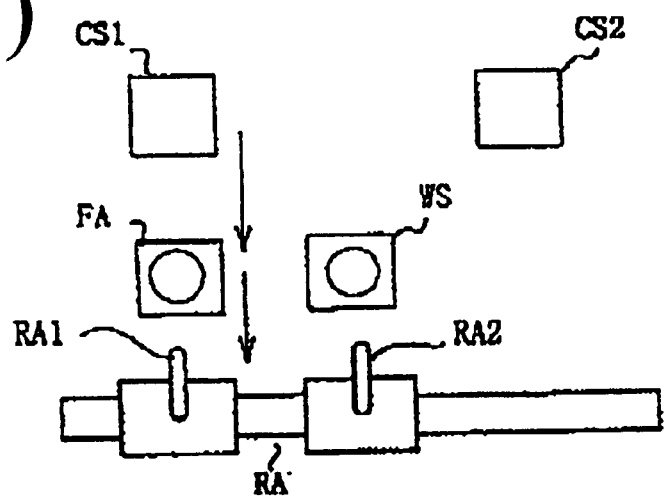

2) The first arm RA1 removes the workpiece Wn, stops at the first extension position and seats the workpiece Wn on the alignment part FA, as is shown in FIG. 8(b). The first arm RA1 is retracted. The workpiece Wn is aligned in the alignment part FA.

Figure 8C:
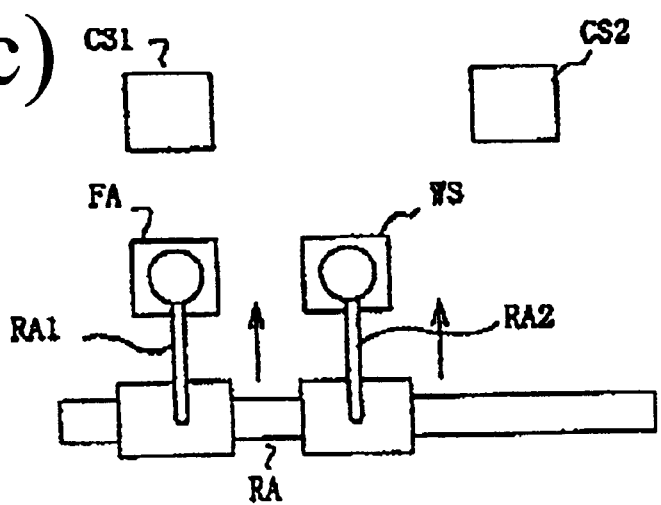

3) After completion of alignment, as is shown in FIG. 8(c), the first arm RA1 is extended to the first extension position and receives the already aligned workpiece Wn from the alignment part FA. Here, according to the movement of the first arm RA1, the second arm RA2 is extended to the first extension position and receives the already exposed n−1-th workpiece Wn−1 from the exposure part WS.

Figure 9A:
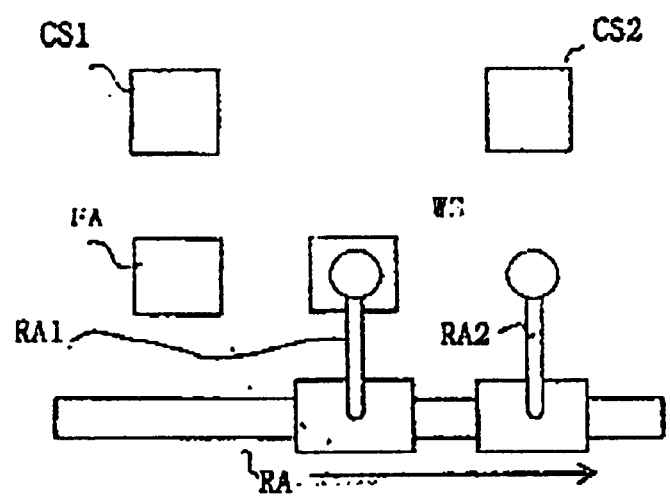
FIGS. 9(a) to 9(c) show further stages of the workpiece transport sequence using the workpiece transport device of the second embodiment.

4) As is shown in FIG. 9(a), the first arm RA1 moves to the exposure part WS in a state in which it fixes the workpiece Wn at the first extension position. The second arm RA2 which fixes the workpiece Wn−1 also moves at the first extension position to a site which is opposite the second cassette receiving part CS2.

Figure 9B:
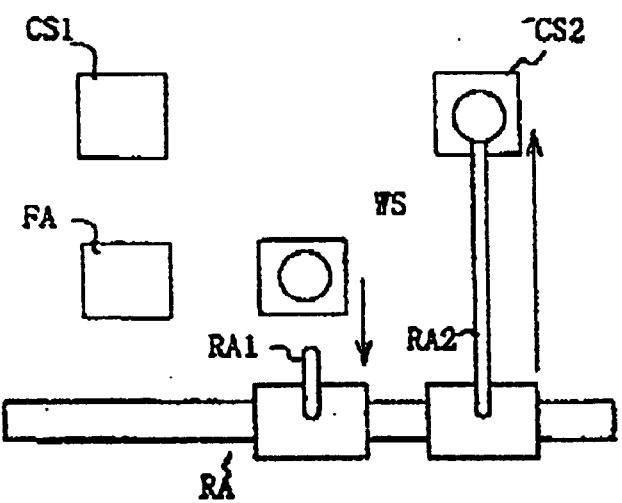

5) As is shown in FIG. 9(b), the first arm RA1 seats the workpiece Wn onto the exposure part WS and is retracted. According to this movement, the second arm RA2 is extended to the second extension position and receives the workpiece Wn−1 into the cassette 2.

Figure 9C:
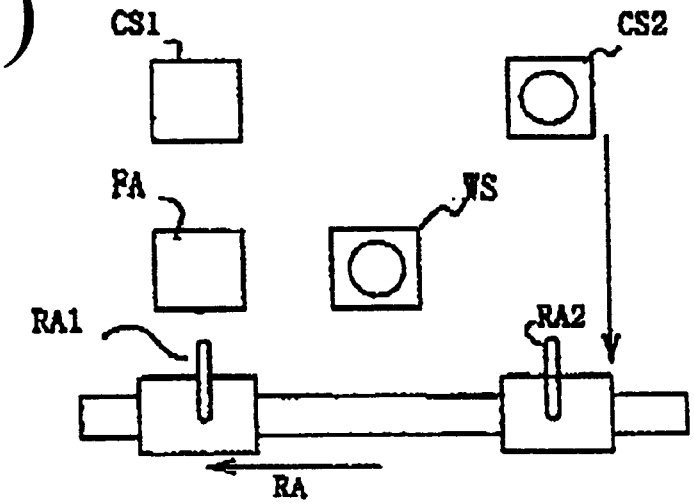

6) As is shown in FIG. 9(c), the second arm RA2 is retracted. With this timing, the first arm RA1 moves to the site which is opposite the first cassette receiving part CST and the alignment part FA.

6) As is shown in FIG. 8(a), the first arm RA1 is extended to the second extension position and fixes the n+1-th workpiece Wn−1 of the cassette 1. With this timing, the second arm RA2 returns to the site which is opposite the exposure part WS.

8) Processes 1) to 7) are repeated.

Figure 10:
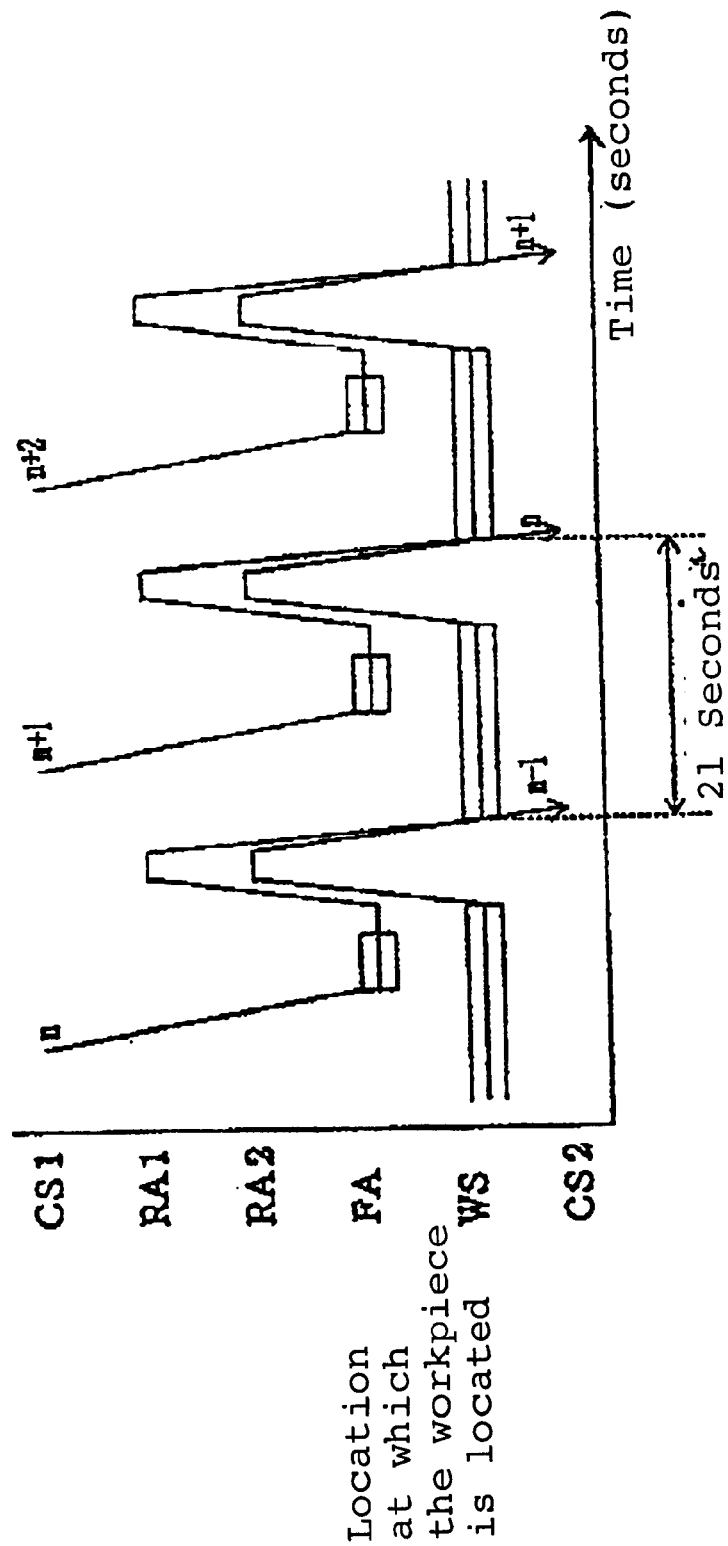
FIG. 10 is a time flow chart which shows the movement and treatment of the workpiece in the second embodiment of the invention.

FIG. 10 shows the movement and treatment of the workpiece in this embodiment. Here, the x-axis, the y-axis and the respective line represent the same as in FIG. 17.

As is apparent from the drawings, the time from starting of the exposure of the n-th workpiece Wn until the start of the treatment of the n+1-th workpiece Wn+1 is 21 seconds, as in the first embodiment. The first arm RA1, however, can be moved to a site which is opposite the first cassette receiving part CS1, when the second arm RA2 receives the workpiece into the cassette 2 and is retracted. Therefore, first arm RA1 can remove the workpiece from the cassette 1 which is seated on the cassette receiving part CS1 and seat it on the alignment part FA in an earlier step than in the second embodiment.

As a result, alignment can start in an earlier step than in the first embodiment. This means that, in the second embodiment, alignment is ended earlier than in the first embodiment. The entire treatment time can be shortened by additional shortening of the treatment time in the exposure part WS.

In workpiece transport, the arms move only in the X-Y direction, as in the first embodiment. Therefore, they do not turn like the robot in the prior art. Accordingly, it is unnecessary to ensure a space for rotation of the arms and for the workpiece which was held by the arms in the vicinity of the workpiece transport device. Thus, the cage-like body of the device can be made smaller.

The two arms are located on the right and left on the same plane. Their movements take place by a linear motor guide or the like, therefore, without joints. Thus, the overall height of the workpiece transport device can be reduced.

As such, the workpiece transport device can be removed from the transverse direction of the device without the frame of the cage-like body being absent. Nor is it necessary to ensure a waiting space above the device. Thus, the entire device can be made smaller.

(3) Other embodiments

Numerous embodiments can be imagined for the device for treatment of a substrate using the workpiece transport devices in the above described first and second embodiments.

Other embodiments are described below.

Figure 11:
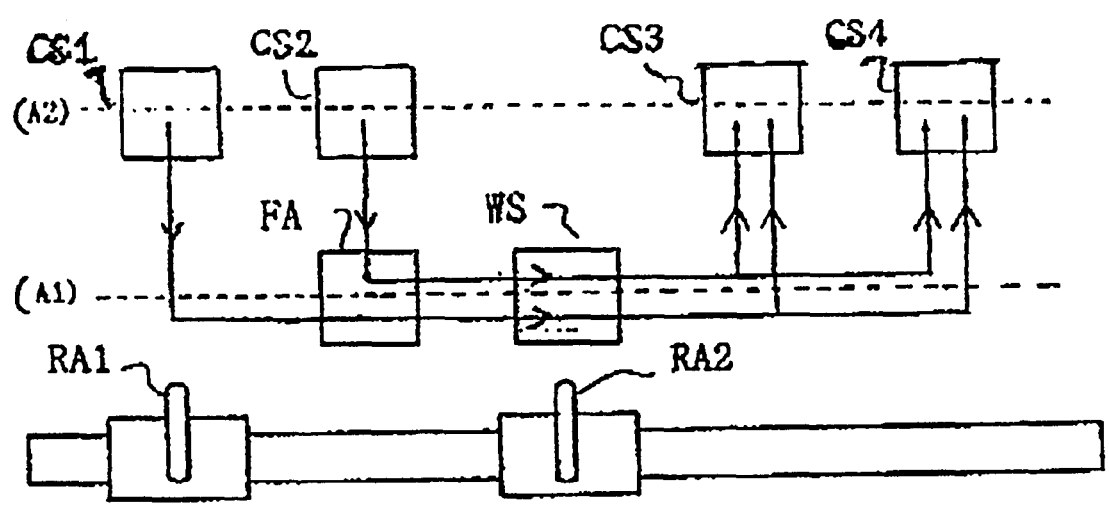
FIG. 11 shows an embodiment of a device for treatment of a substrate using the workpiece transport devices of the first and second embodiments.
Figure 12:
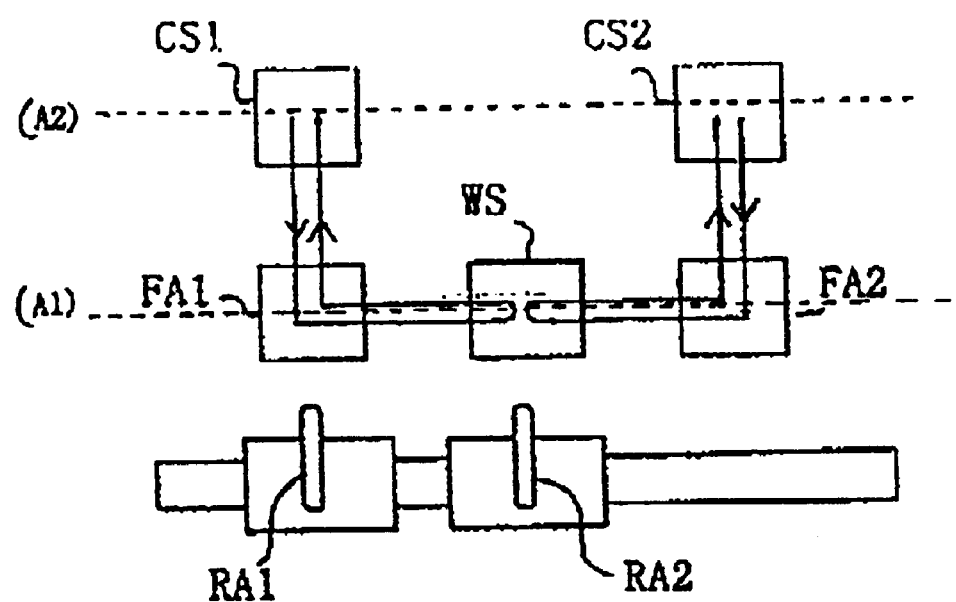
FIG. 12 shows another embodiment of a device for treatment of a substrate using the workpiece transport devices of the first and second embodiments.
Figure 13:
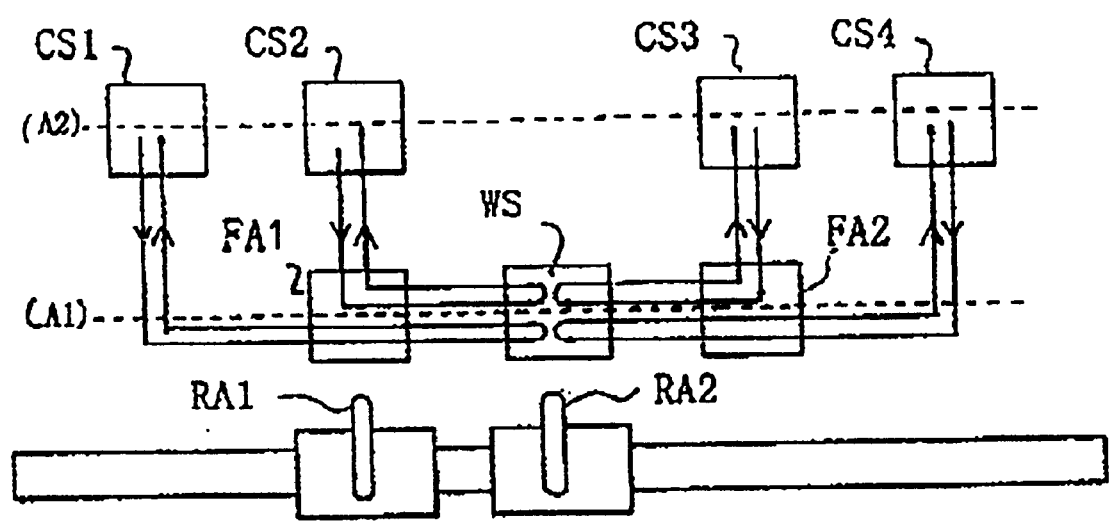
FIG. 13 shows a third embodiment of a device for treatment of a substrate using the workpiece transport devices of the first and second embodiments.
Figure 14:
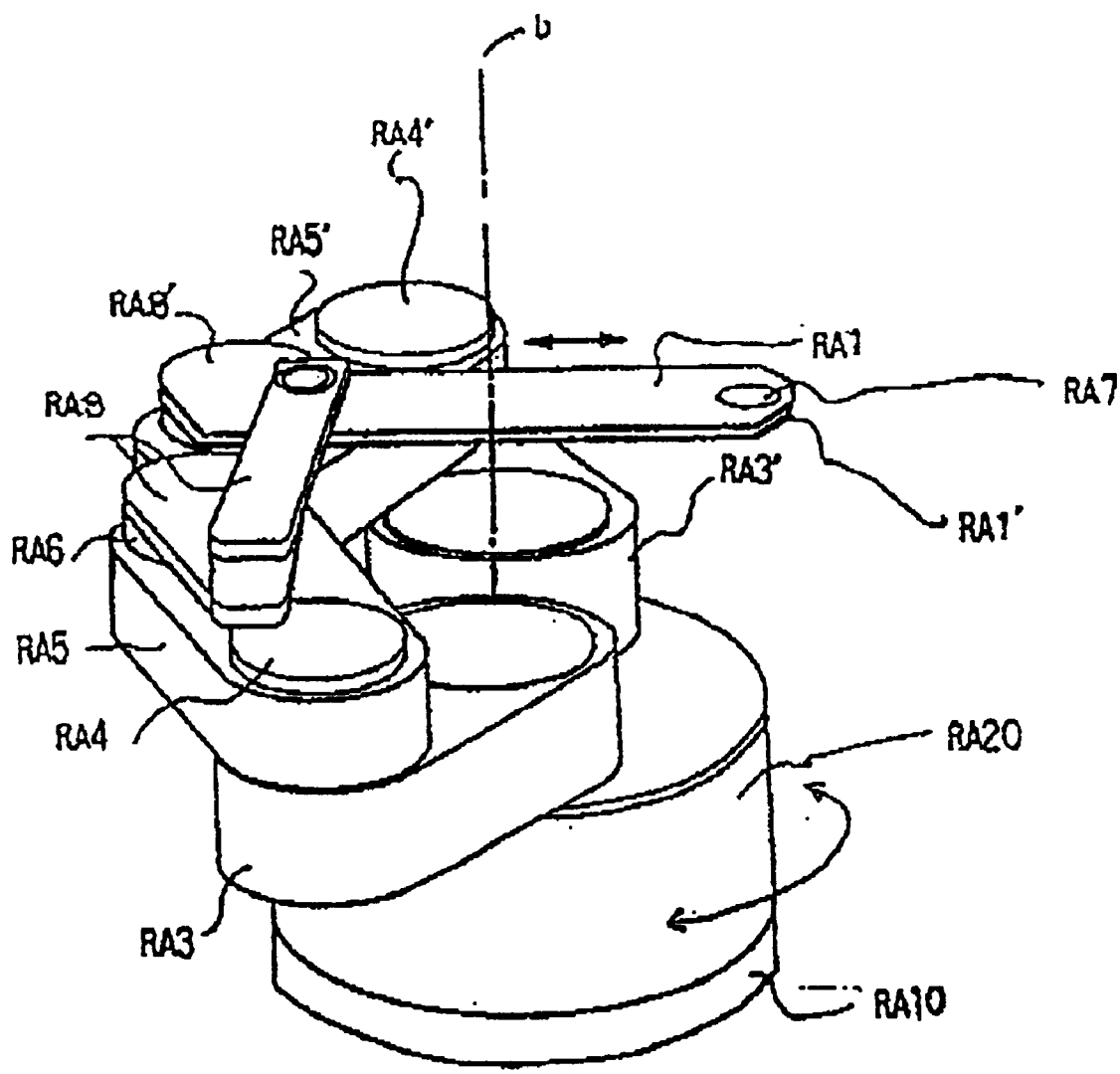
FIG. 14 is a perspective view of one example of a conventional workpiece transport device (robot)
Figure 15:
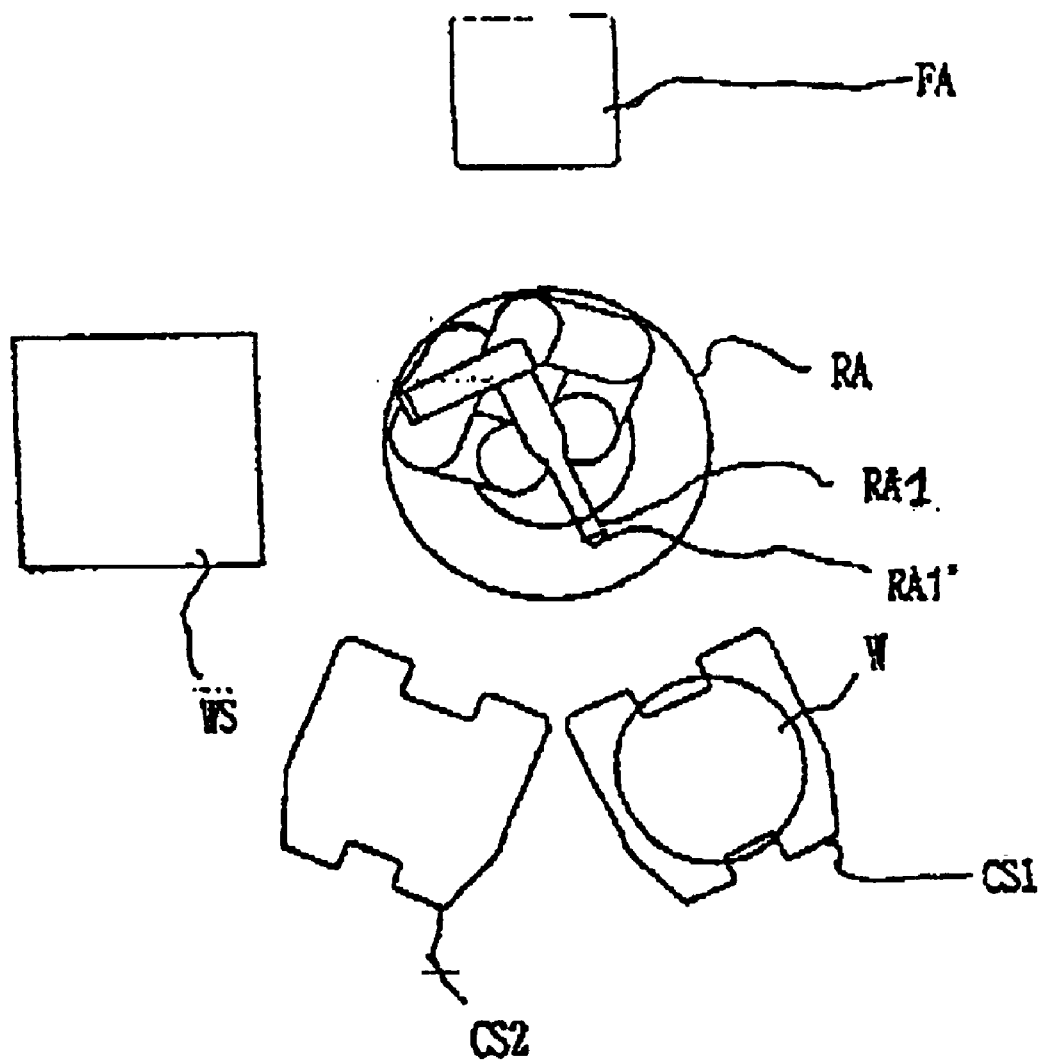
FIG. 15 is a schematic plan view of one example of the arrangement of the conventional workpiece transport device, of treatment parts and cassette receiving parts in a device for treatment of the substrate.
Figure 16A:
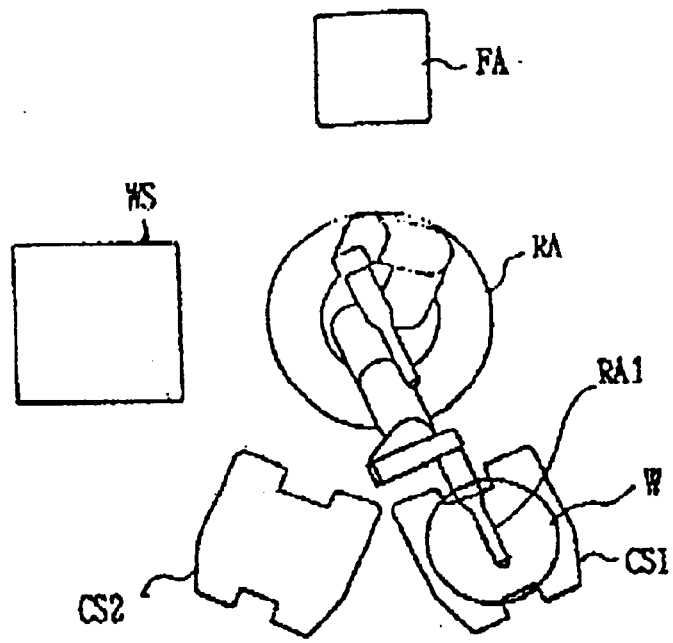
FIGS. 16(a) to 16(c) each show a step in the workpiece transport sequence in the device for treatment of a substrate as shown in FIG. 15.
Figure 16B:
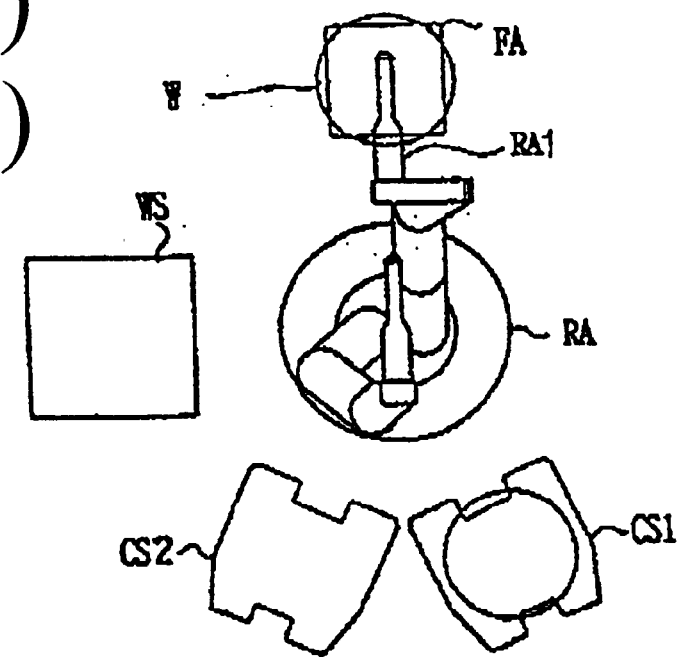
Figure 16C:
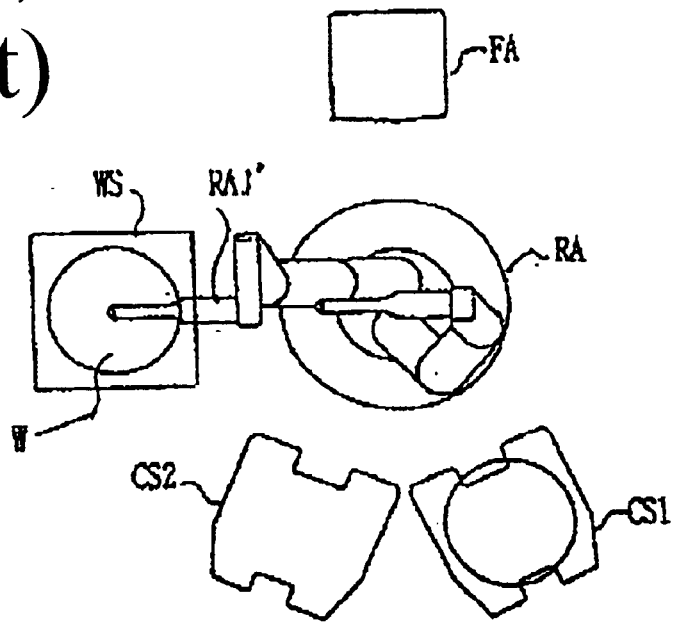
Figure 16D:
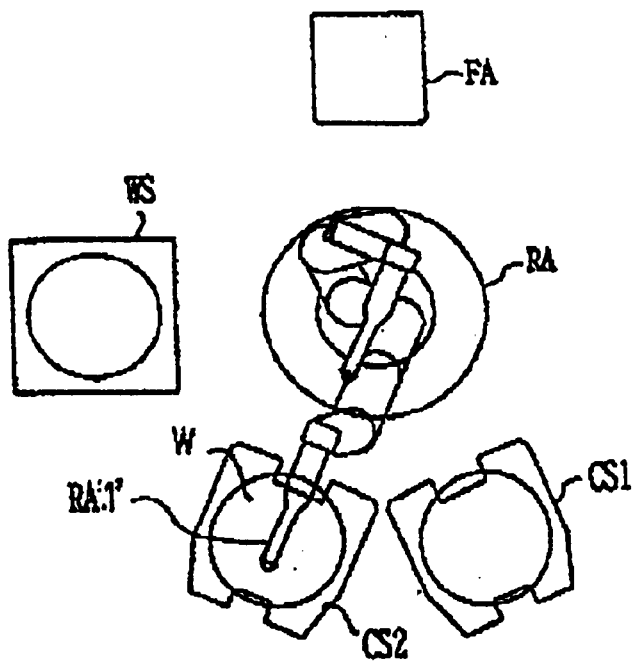
Figure 16E:
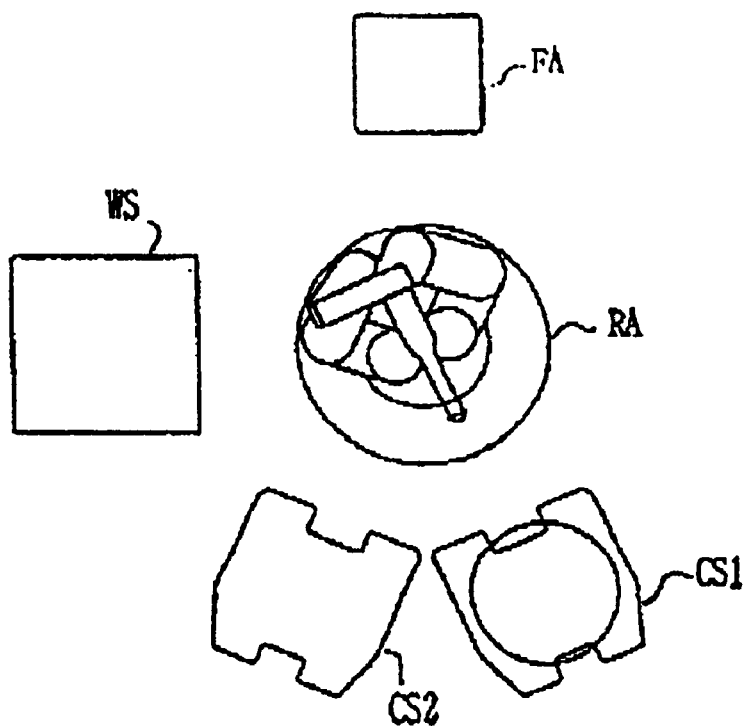

FIGS. 11 to 13 show a case in which the workpiece transport device in the second embodiment is used; but, the transport and the treatment is performed in the same manner as when using the workpiece transport device of the first embodiment.

a) FIG. 11 shows an embodiment which uses four cassette receiving parts CS1 to CS4 and one workpiece transport device in which the arms RA1, RA2 can move independently of one another in the Y direction as in the second embodiment.

In this embodiment, the alignment part FA and the exposure part WS are located on a first virtual line A1 which runs parallel to the direction of movement of the workpiece transport device. The four cassette receiving parts CS1 to CS4 are located on a second virtual line A2 which runs parallel to the first virtual line A1.

In the embodiment in FIG. 11, the workpiece W is removed from the cassette 1 which has been seated on the first cassette receiving part CS1, alignment and exposure are performed in the alignment part FA and in the exposure part WS, and the already treated workpiece is received into a cassette 3 which has been seated on the third cassette receiving part CS3 and into a cassette 4 which has been seated on the fourth cassette receiving part CS4.

Parallel thereto, the workpiece W is removed from the cassette 2 which has been seated on the second cassette receiving part CS2, alignment and exposure performed in the alignment part FA and in the exposure part WS, and the already treated workpiece is received into a cassette 3 and into a cassette 4.

b) FIG. 12 shows an embodiment which uses two cassette receiving parts CS1, CS2, two alignment parts FA1, FA2 and one workpiece transport device, in which the arms RA1, RA2 can move independently of one another in the Y-direction as described in the second embodiment. Further-more, two alignment parts FA1, FA2 and the exposure part WS are located on a first virtual line A1 which runs parallel to the direction of movement of the workpiece transport device, and two cassette receiving parts CS1, CS2 are located on a second virtual line A2 which runs parallel to the first virtual line A1.

In this embodiment, the already treated workpiece W is received into the same cassette as the cassette from which the workpiece W has been removed, after the workpiece W has been removed from the cassette and alignment and exposure have been performed. This means that the workpiece W is removed from the cassette 1 which has been seated on the first cassette receiving part CS1, is aligned in the alignment part FA1, transported to the exposure part WS and subjected to exposure, and the already treated workpiece W is received into the cassette 1. Parallel thereto, the workpiece W is removed from the cassette 2 which has been seated on the second cassette receiving part CS2, is aligned in the alignment part FA2, transported to the exposure part WS and subjected to exposure, and the already treated workpiece W is received into the cassette 2.

c) FIG. 13 shows an embodiment in which four cassette receiving parts CS1 to CS4 and two alignment parts FA1 to FA2 are used, and furthermore, a workpiece transport device is used in which the arms RA1, RA2 can move independently of one another in the Y direction as in the second embodiment.

In this embodiment, the two alignment parts FA1 and FA2 and the exposure part WS are located on a first virtual line A1 which runs parallel to the direction of movement of the workpiece transport device. The four cassette receiving parts CS1 to CS4 are located on a second virtual line A2 which runs parallel to the first virtual line A1.

In this embodiment, the workpiece is received into the same workpiece cassette as the cassette from which the workpiece has been removed, as in the embodiment in FIG. 12.

This means that the workpiece W is removed from the cassette 1 which is seated on the first cassette receiving part CS1, aligned in the alignment part FA1, transported to the exposure part WS, and subjected to exposure, and the already treated workpiece W is received into the cassette 1.

Likewise, the workpiece W is removed from the cassette 2 which is seated on the second cassette receiving part CS2, aligned in the alignment part FA2, transported to the exposure part WS and subjected to exposure, and the already treated workpiece W is received into the cassette 2.

Likewise, the workpiece W is treated in the following sequence:

Cassette 3→FA2→exposure part WS→Cassettes 3 and 4→alignment part FA2→Exposure part WS→cassette 4.

As was described above, in a conventional robot which transports the workpiece by rotary motion, the treatment parts and cassette receiving parts can only be located around the circular periphery of the robot. The range of application was therefore limited. Using the workpiece transport device of the present invention, for example, one of the different transport systems shown in FIGS. 11 to 13 can be chosen, and thus, effective transport can be achieved.

ACTION OF THE INVENTION

As was described above, the following actions can be obtained as claimed in the invention:

(1) The measure that in the workpiece transport device transport takes place by linear motion, and that two workpiece holding arms are located on the right and left on the same plane, makes it unnecessary to ensure a space for rotation of the workpiece transport device. Thus, the cagelike body of the device can be made smaller.

(2) Since the overall height of the workpiece transport device becomes less, it becomes possible to remove the workpiece transport device in the transverse direction of the device without the frame of the cage-like body being partially absent. Therefore, the entire device can be made smaller without a waiting space needing to be provided above the transport device.

(3) The workpiece can be transported away from the first treatment part and the second treatment part at the same time by the arrangement of the cassette receiving parts which hold the cassettes on a virtual line which runs parallel to the direction of motion of the second base plate, and by arranging the first treatment part and the second treatment part on another virtual line which is parallel to the above described virtual line, and furthermore, by the measure that, in the first and second treatment parts, the workpiece can be transported in and out from each direction. Furthermore, the workpiece can be inserted into the second treatment part and received into the cassette at the same time.

Therefore the following effects can be obtained:

1) The next workpiece can be removed from the cassette in an earlier step and treated in the first treatment part. Therefore, the waiting time in the second treatment part can be shortened.

2) The time in which the already treated workpiece in the second treatment part is exchanged for the next workpiece can be shortened.

4) The time in which the arms remove the workpiece from the cassette and seat it on the first treatment part can be shortened. Furthermore, the treatment in the first treatment part can be started and ended in an earlier step, and thus, the waiting time in the second treatment part can be shortened even more.

5) By arranging the two workpiece holding alms Such that they do not come into contact with one another and can move independently of one another, the second arm can move to a position which is opposite the other cassette when the first arm receives the workpiece into the cassette and is retracted. Therefore, first arm can remove the workpiece from the cassette and seat it on the first treatment part in an earlier step. As a result, treatment can start and end in the first treatment part in an earlier step, and thus, the waiting time in the second treatment part can be shortened even more. In this way, the throughput can be greatly improved.

6) Different transport systems can be chosen and treatments can be performed with high efficiency.

What is claimed is:

1. Device for treating a substrate which comprises:

a plurality of cassette receiving parts for workpiece-receiving cassettes;

a first treatment part for performing a first treatment on a workpiece;

a second treatment part for performing a second treatment takes on the workpiece following the first treatment by the first treatment part; and a first base plate;

at least one second base plate which is linearly movable on the first base plate; and a first transport part and a second transport part, each of which is located on said at least one second base plate;

wherein the first transport part and the second transport part each have a holding part for securely holding the workpiece;

the holding parts, each of which has a transport device, are movable in a direction which orthogonally intersects a direction of movement of the at least one second base plate, the transport device of the holding part of the first transport part being movable independently of the holding part of the second transport part;

the cassette receiving parts are located on a first virtual line which runs parallel to the direction of motion of the at least one second base plate; and the treatment parts are located on a second virtual line which runs parallel to the first virtual line.

2. Device for treating a substrate as claimed in claim 1, wherein said at least one second base plate is a single, one-piece, second base plate; and wherein the cassette receiving parts and the treatment parts are spaced at the same distance relative to each other as the two transport parts are spaced relative to each other.

3. Device for treating a substrate as claimed in claim 1, wherein said at least one second base plate comprises two separate base plates that are movable independently of each other, each of said base plates carrying a respective one of said holding parts.

* * * * *